US007482623B2

(12) United States Patent
Nishikawa et al.

(10) Patent No.: US 7,482,623 B2
(45) Date of Patent: Jan. 27, 2009

(54) ORGANIC SEMICONDUCTOR FILM AND ORGANIC SEMICONDUCTOR DEVICE

(75) Inventors: Takao Nishikawa, Nagano (JP);
Yoshihiro Iwasa, Miyagi (JP);
Shin-ichiro Kobayashi, Miyagi (JP);
Taishi Takenobu, Miyagi (JP)

(73) Assignee: Seiko Epson Corporation (JP)

( * ) Notice: Subject to any disclaimer, the term of this patent is extended or adjusted under 35 U.S.C. 154(b) by 297 days.

(21) Appl. No.: 11/085,460

(22) Filed: Mar. 21, 2005

(65) Prior Publication Data
US 2005/0208400 A1 Sep. 22, 2005

(30) Foreign Application Priority Data
Mar. 22, 2004 (JP) .............................. 2004-082912

(51) Int. Cl.
H01L 29/08 (2006.01)
H01L 35/24 (2006.01)
H01L 51/00 (2006.01)
H01L 21/00 (2006.01)
H01L 51/40 (2006.01)
H01L 21/336 (2006.01)
H01L 21/8234 (2006.01)
H01L 21/8238 (2006.01)
H01L 21/3205 (2006.01)
H01L 21/4763 (2006.01)

(52) U.S. Cl. .................. 257/40; 257/350; 257/410; 257/411; 257/E51.049; 438/82; 438/99; 438/216; 438/261; 438/421; 438/591; 438/595; 438/287; 438/954; 438/981; 438/197; 438/198; 438/199; 438/200; 438/201

(58) Field of Classification Search .................. 257/40, 257/57, 59, 66, 72, 347, 350–351, E51.008–E51.039, 257/410, 411, E51.049; 438/82, 99, 216, 438/261, 421, 591, 595, 287, 954, 981, 197–201
See application file for complete search history.

(56) References Cited

U.S. PATENT DOCUMENTS
4,015,281 A * 3/1977 Nagata et al. ................ 257/392

(Continued)

FOREIGN PATENT DOCUMENTS
EP 1102335 A2 * 5/2001

(Continued)

OTHER PUBLICATIONS

D.J. Gundlach et al., "Thin-film transistors based on well-ordered thermally evaporated napthaceen films", American Institute of Physics, vol. 80, No. 16, pp. 2925-2927 (2002).*

(Continued)

*Primary Examiner*—Steven Loke
*Assistant Examiner*—Arman Khosraviani
(74) *Attorney, Agent, or Firm*—Harness, Dickey & Pierce, P.L.C.

(57) ABSTRACT

An organic semiconductor device includes a substrate, a gate electrode formed directly on the substrate, gate insulating film formed directly on the gate electrode, a source electrode and a drain electrode formed directly on the gate insulating film, an organic semiconductor layer formed directly on the source electrode and the drain electrode, and a voltage control layer disposed directly between the gate insulating film and the organic semiconductor layer and directly contacting the source electrode and the drain electrode, wherein the voltage control layer gives an ambipolar characteristic to the organic semiconductor layer.

7 Claims, 9 Drawing Sheets

U.S. PATENT DOCUMENTS

| | | | | |
|---|---|---|---|---|
| 5,510,645 | A | * | 4/1996 | Fitch et al. .................. 257/522 |
| 6,433,359 | B1 | * | 8/2002 | Kelley et al. ................... 257/40 |
| 6,734,499 | B1 | * | 5/2004 | Yamazaki .................. 257/347 |
| 6,768,132 | B2 | * | 7/2004 | Smith et al. ................. 257/410 |
| 6,870,181 | B2 | * | 3/2005 | Zhang et al. .................. 257/40 |
| 6,891,237 | B1 | * | 5/2005 | Bao et al. ................... 257/410 |
| 6,905,906 | B2 | * | 6/2005 | Sirringhaus et al. ........... 438/99 |
| 6,946,332 | B2 | * | 9/2005 | Loo et al. ................... 438/149 |
| 7,064,345 | B2 | * | 6/2006 | Fix et al. ....................... 257/40 |
| 7,091,517 | B2 | * | 8/2006 | Buriak et al. ................. 257/40 |
| 7,098,061 | B2 | * | 8/2006 | Sirringhaus et al. ........... 438/30 |
| 7,102,155 | B2 | * | 9/2006 | Ando et al. .................... 257/40 |
| 7,109,519 | B2 | * | 9/2006 | Gerlach ......................... 257/40 |
| 7,138,682 | B2 | * | 11/2006 | Kamata et al. ................ 257/40 |
| 7,154,147 | B1 | * | 12/2006 | Yamazaki et al. ........... 257/347 |
| 7,202,495 | B2 | | 4/2007 | Unno |
| 2002/0167003 | A1 | * | 11/2002 | Campbell et al. ............. 257/40 |
| 2003/0059975 | A1 | * | 3/2003 | Sirringhaus et al. ........... 438/99 |
| 2004/0061176 | A1 | * | 4/2004 | Takafuji et al. .............. 257/347 |
| 2004/0214381 | A1 | | 10/2004 | Ohta |
| 2005/0032268 | A1 | * | 2/2005 | Nishikawa et al. ............ 438/99 |
| 2005/0051770 | A1 | * | 3/2005 | Ando et al. .................... 257/40 |
| 2006/0243965 | A1 | * | 11/2006 | De Leeuw et al. ............ 257/40 |

FOREIGN PATENT DOCUMENTS

| | | | |
|---|---|---|---|
| JP | 2001-244467 | | 9/2001 |
| JP | 2004-23021 | | 1/2004 |
| JP | 2004082912 A | * | 3/2004 |
| JP | 2004-327857 | | 11/2004 |
| WO | WO03-041185 | | 5/2003 |
| WO | WO03/041186 | | 5/2003 |
| WO | WO2004/001705 | | 12/2003 |
| WO | WO 2004068267 A2 | * | 8/2004 |

OTHER PUBLICATIONS

"Organic Thin-Film Transistors for Organic Light-Emitting Flat-Panel Display Backplanes", by Thomas N. Jackson, Yen-Yi Lin, David J. Gundlach, and Hagen Klauk; IEEE Journal of Selected Topics in Quantum Electronics, vol. 4, No. 1, Jan./Feb. 1998.

D.J. Gundlach et al., "Thin-film transistors based on well-ordered thermally evaporated naphthacene films", American Institute of Physics, vol. 80, No. 16, pp. 2925-2927 (2002).

* cited by examiner

ORGANIC SEMICONDUCTOR FILM AND ORGANIC SEMICONDUCTOR DEVICE

RELATED APPLICATIONS

This application claims priority to Japanese Patent Application No. 2004-82912 filed Mar. 22, 2004 which is hereby expressly incorporated by reference herein in its entirety.

BACKGROUND

1. Technical Field

The present invention relates to an organic semiconductor film and an organic semiconductor device having the organic semiconductor film.

2. Related Art

Examples of semiconductor devices include thin film transistors (TFT) that have been put to practical use as switching elements in an active matrix liquid crystal display, for instance, and designed to use an amorphous or polycrystalline silicon semiconductor film.

As TFT semiconductor materials, organic semiconductor materials have drawn attention in recent years. Organic semiconductors can be easily processed into a thin film by a simple deposition method such as spin coating and vacuum deposition, and processed at lower temperatures than conventional TFT using amorphous or polycrystalline silicon. Lower processing temperatures permit the forming on a plastic substrate with low thermal resistance, and thereby having various expected effects including reduction in display weight and manufacturing cost and versatile applications utilizing the flexibility of a plastic substrate.

In developing TFT using conventional organic semiconductor materials, however, it is difficult to control the threshold voltage and channel conductivity by impurity doping, which is performed for TFT using amorphous or polycrystalline silicon. This has been one of the factors preventing its practical use. A technology reported by Jiyoul Lee et al (e.g. *Applied Physics Letters*, Vol. 80: 2925-27, 2002) relates to threshold voltage, but it is not intended to arbitrarily control threshold voltage.

As for the control of channel conductivity, it is necessary to select appropriate organic semiconductor materials to manufacture n-channel or p-channel thin film transistors.

A complementary metal-oxide semiconductor (CMOS) transistor which consists of an n-channel MOS (nMOS) transistor and a p-channel MOS (pMOS) transistor that are combined in an IC chip is widely known as a semiconductor device. The CMOS transistor has a basic structure in which enhancement-mode nMOS and PMOS transistors are coupled in series and has n-channel and p-channel regions.

However, impurity cannot be doped into an organic semiconductor material for producing the CMOS transistor. Therefore, it is necessary to produce semiconductor films for the n-channel and p-channel regions separately, which complicates the manufacturing process and reduce productivity.

In consideration of the above-described problem, the present invention aims to provide an organic semiconductor film and organic semiconductor device that are capable of producing n-channel and/or p-channel regions without changing materials for forming organic semiconductor thin films in particular, and also capable of controlling threshold voltage.

SUMMARY

An organic semiconductor film according to the present invention includes an organic semiconductor layer and a voltage control layer giving an ambipolar characteristic to the organic semiconductor layer.

With this organic semiconductor film, since the voltage control layer gives ambipolar characteristics to the organic semiconductor layer, the organic semiconductor film including the organic semiconductor layer has the ambipolar characteristics, making it possible to form n-channel and/or p-channel regions with the same material. By appropriately selecting the voltage control layer, it is possible not only to give ambipolar characteristics, but also to control threshold voltage.

Here, an ambipolar characteristic is what is defined mainly in the field of organic semiconductors and, exhibits p-type characteristics when holes are injected as carriers and n-type characteristics when electrons are injected as carriers.

In accordance with the present invention, it can be also said that a voltage control layer gives ambipolar characteristics to an organic semiconductor layer in the following case: the current-voltage characteristics of an organic semiconductor layer intrinsically having but not exhibiting ambipolar characteristics under its normal working condition as mentioned later are changed by providing a voltage control layer, so that it can exhibit the ambipolar characteristics in its normal working condition.

An organic semiconductor device according to the present invention includes a gate insulating layer, an organic semiconductor layer, and a voltage control layer disposed in between the gate insulating film and the organic semiconductor layer and giving an ambipolar characteristic to the organic semiconductor layer.

With this organic semiconductor device, since the voltage control layer gives ambipolar characteristics to the organic semiconductor layer, the organic semiconductor layer has the ambipolar characteristics, making it possible to form n-channel and/or p-channel regions with the same material. Therefore, it is applicable to both n-channel MOS (nMOS) and p-channel MOS (pMOS) transistors with the same material, without changing semiconductor materials for forming their channel regions. It is also possible to form a complementary metal-oxide semiconductor (CMOS) transistor with the same material, without changing semiconductor materials for individual channel regions. In addition, it is possible to control threshold voltage by appropriately selecting the voltage control layer.

In the organic semiconductor device, the thickness of the voltage control layer is preferably 3 nm or less.

This way the voltage control layer is made so thin that a transistor can be handled as if it has no voltage control layer in design and manufacturing processes, and thus providing the voltage control layer places almost no additional restrictions. In addition, it is economical to form the voltage control layer with a small amount of materials.

Also in the organic semiconductor device, the voltage control layer is preferably chemically absorbed to at least one of the gate insulating film and the organic semiconductor layer.

By being chemically absorbed, the layer is deposited to be dense and rigid even if it is ultrathin, and works very effectively.

Also in the organic semiconductor device, the voltage control layer is preferably made of a silane compound.

The silane compound is easily chemically absorbed to a surface, as preferably used as the gate insulating film, that has been oxidized such as $SiO_2$ and $Al_2O_3$ or treated to be lyophilic by a simple lyophilic treatment. Therefore, a dense and rigid ultrathin film (monomolecular film) is formed, which is particularly preferable as the voltage control layer. Here, the lyophilic treatment means a process for forming a hydroxyl group on a surface.

In the organic semiconductor device, the silane compound preferably includes at least one trifluoromethyl group.

The voltage control layer made of the silane compound also works effectively to shift threshold voltage to the positive side.

Also in the organic semiconductor device, the organic semiconductor layer may be made of at least one of the following: organic low-molecular substances such as pentacene and oligothiophene; organic polymers such as polythiophene; metal complexes such as phthalocyanine; fullerenes including $C_{60}$, $C_{82}$, and metallofullerenes incorporating metal (e.g. a fullerene incorporating dysprosium (Dy) or Dy@$C_{82}$); and carbon nanotubes.

The organic semiconductor device may be an organic thin film transistor.

Accordingly, since the voltage control layer gives ambipolar characteristics to the organic semiconductor layer, the organic semiconductor layer has the ambipolar characteristics, making it possible to form n-channel and/or p-channel regions with the same material in the organic thin film transistor. The organic thin film transistor is thus applicable to both n- and p-types.

The organic semiconductor device may be a complementary transistor.

Accordingly, since the voltage control layer gives ambipolar characteristics to the organic semiconductor layer, the organic semiconductor layer has the ambipolar characteristics, making it possible to form each semiconductor layer with the same material, without changing semiconductor materials for individual channel regions in the complementary (CMOS) transistor.

DETAILED DESCRIPTION

The present embodiment will now be described in greater detail.

Organic Thin Film Transistor

Figure 1:
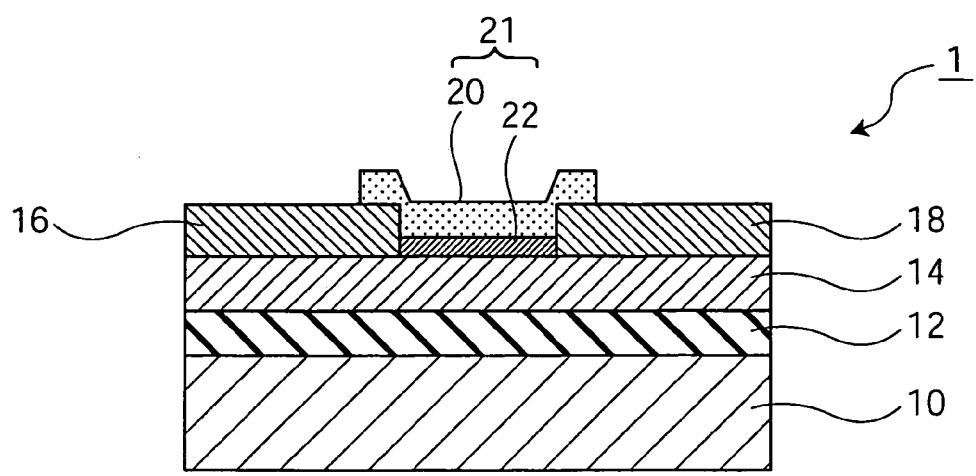
FIG. 1 is a sectional view schematically showing an organic thin film transistor according to the present invention.

FIG. 1 is a view illustrating an embodiment of an organic semiconductor device according to the present invention that is applied to an organic thin film transistor. FIG. 1 shows an organic thin film transistor 1. The organic thin film transistor 1 includes a gate electrode 12 and a gate insulating film 14 that are provided in this order on a substrate 10, and also includes a source electrode 16 and a drain electrode 18 that are provided on the gate insulating film 14. The organic thin film transistor 1 also includes an organic semiconductor film 21 that is provided between the source electrode 16 and the drain electrode 18. The organic semiconductor film 21 is an embodiment of the organic semiconductor film according to the present invention and consists of an organic semiconductor layer 20 and a voltage control layer 22 that gives ambipolar characteristics to the organic semiconductor layer 20. The voltage control layer 22 and the organic semiconductor layer 20 are provided in this order on the gate insulating film 14.

Fullerenes including $C_{60}$, $C_{82}$, and metallofullerenes incorporating metal (e.g. a fullerene incorporating dysprosium (Dy), hereinafter referred to as Dy@$C_{82}$) are preferably used as a material of the organic semiconductor layer 20. Alternatively, organic low-molecular substances such as pentacene and oligothiophene, organic polymers such as polythiophene, metal complexes such as phthalocyanine, and carbon nanotubes can also be used.

An appropriate material of the voltage control layer 22, which gives ambipolar characteristics to the organic semiconductor layer 20 made of the above-described materials, is selected depending on the material of the organic semiconductor layer 20. Specifically, if the organic semiconductor layer 20 is made of a fullerene, the voltage control layer 22 is preferably made of a silane compound. Here, silane compounds represented by the formula $R^1(CH_2)_m SiR^2{}_n X_{3-n}$ (m: a counting number; n: 1 or 2) are used, for example. With a silane compound represented by this formula in which X is in the halogen or alkoxy group, for example, it is easily chemically absorbed to a surface, as preferably used as the gate insulating film 14, that has been oxidized such as $SiO_2$ and $Al_2O_3$, and thereby forming a dense and rigid ultrathin film (monomolecular film). As a result, the end group $R^1$ is disposed on the surface of the voltage control layer 22. Accordingly, its chemical affinity for the organic semiconductor layer 20 made of a fullerene, for example, is strong. The $R^2$ is hydrogen, in the alkyl group such as the methyl group ($—CH_3$), or their derivatives.

With the voltage control layer 22, the methyl group ($—CH_3$) or trifluoromethyl group ($—CF_3$) is preferably used as the $R^1$ in the formula to provide a silane compound desirably giving ambipolar characteristics to the organic semiconductor layer 20 made of a fullerene, in particular. The voltage control layer 22 not only gives ambipolar characteristics to the organic semiconductor layer 20, but also controls the threshold voltage of the organic thin film transistor. More specifically, it the controls threshold voltage characteristics of the organic semiconductor layer 20 by adequately changing the $R^1$.

The thickness of the voltage control layer 22 is preferably 3 nm or less.

By making the voltage control layer 22 so thin that the organic thin film transistor 1 can be handled as if it has no voltage control layer 22 in design and manufacturing processes, providing the voltage control layer 22 places almost no additional restrictions. Also, it is economical to form the voltage control layer with a small amount of materials.

Referring now to FIGS. 2A to 2D, a method for manufacturing the organic thin film transistor 1 with the above-described structure will be described.

As the substrate 10, a p- or n-type single crystal silicon substrate in which an impurity such as boron (B), phosphorous (P) or antimony (Sb) is doped; glass substrate; quartz substrate; or plastic substrate such as polymethylmethacrylate, polyethersulphone, or polycarbonate is prepared.

Figure 2A:
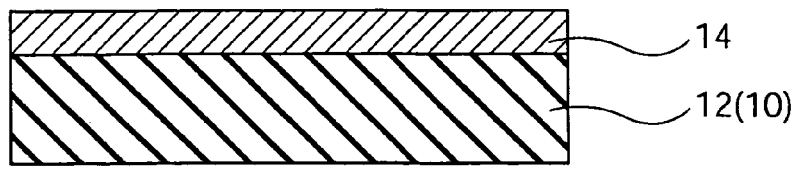
FIGS. 2A to 2D are process drawings illustrating the manufacturing of the organic thin film transistor shown in FIG. 1.

In the present embodiment, a single crystal silicon substrate in which an impurity is doped is used as the substrate 10 to be the gate electrode 12 as shown in FIG. 2A.

Subsequently, the gate insulating film 14 is formed to a thickness of about 100 to 800 nm on the substrate 10 (gate electrode 12). A method for forming the gate insulating film 14 is not particularly limited. For example, the surface of the substrate may be oxidized by thermal oxidation to form silicon dioxide ($SiO_2$) to be the gate insulating film 14. Alternatively, an insulating film made of $SiO_2$, $Al_2O_3$ or the like may be formed by sputtering or vacuum deposition such as chemical vapor deposition (CVD) to be the gate insulating film 14.

Figure 2B:
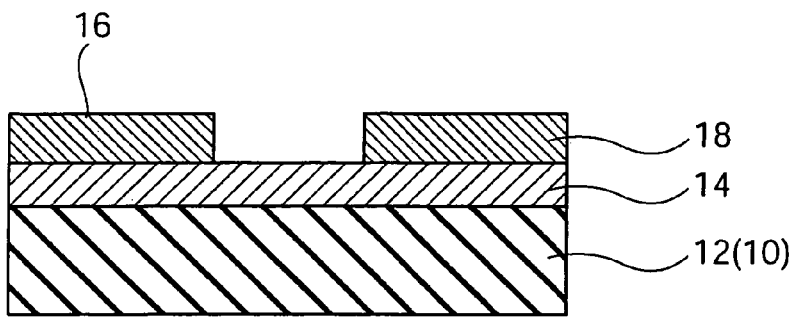

The source electrode 16 and the drain electrode 18 are formed to a thickness of about 50 to 300 nm as shown in FIG. 2B. Materials of the source electrode 16 and the drain electrode 18 are not particularly limited. For example, various kinds of metals, metal oxides, and carbon can be used. Specifically, if the organic semiconductor layer 20 is made of a fullerene ($C_{60}$, $C_{82}$, and a metallofullerene incorporating metal), the source electrode 16 and the drain electrode 18 are preferably made of platinum (Pt), gold (Au), silver (Ag), copper (Cu), aluminum (Al), or indium tin oxide (ITO), for example. In order to form the source electrode 16 and the drain electrode 18 having a predetermined shape, for example, a conductive thin film is formed on the gate insulating film 14 by vacuum deposition and then the thin film is patterned by lithography.

Figure 2C:
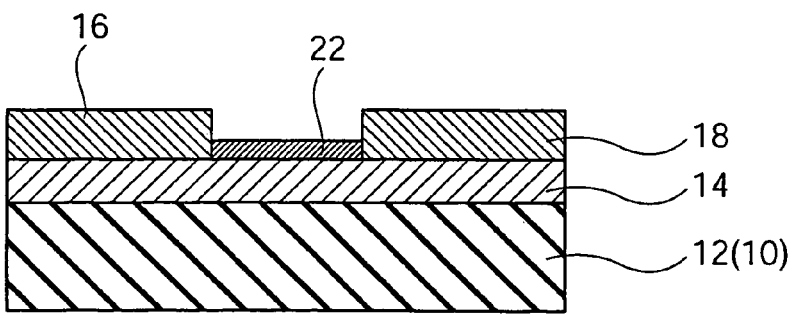

The voltage control layer 22 is formed to a thickness of 3 nm or less, for example, as shown in FIG. 2C. As mentioned above, the voltage control layer 22 gives ambipolar characteristics to the organic semiconductor layer 20. If the organic semiconductor layer 20 is made of a fullerene, silane compounds represented by the formula $R^1(CH_2)_m SiR^2_n X_{3-n}$ (m: a counting number; n: 1 or 2) are preferably used. Such a silane compound with X being in the halogen or alkoxy group in particular is easily chemically absorbed to the oxide surface made of $SiO_2$ or $Al_2O_3$, for example, of the gate insulating film 14. Therefore, a dense and rigid ultrathin film (monomolecular film) is formed.

Additionally, by disposing the end group $R^1$ on the surface of the voltage control layer 22, its chemical affinity for the organic semiconductor layer 20 made of a fullerene, for example, is strong.

Here, silane compounds below are preferably used as silane compounds represented by the above-mentioned formula:

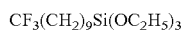  (a)

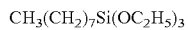  (b)

Such silane compounds not only give ambipolar characteristics to the organic semiconductor layer 20, but also control threshold voltage characteristics of the organic semiconductor layer 20.

A method for forming the voltage control layer 22 is not particularly limited. For example, vapor phase methods such as CVD, and liquid phase methods such as spin coating and dipping can be used. Also, deposition and patterning can be performed at the same time by mask deposition, for example.

Before forming the voltage control layer 22, at least its underlying surface (the gate insulating film 14 here) may be treated to be lyophilic, so that a material forming the voltage control layer 22 can be easily chemically absorbed to the underlying surface. Vacuum ultraviolet rays of a wavelength of 150 to 200 nm and oxygen ($O_2$) plasma can be employed for the lyophilic treatment, for example.

After forming the voltage control layer 22, unnecessary adsorbates may be removed by cleansing with alcohols such as ethanol or 2-propanol, or with ultrapure water.

Note that it is sufficient to form the voltage control layer 22 in a partial area between the gate insulating film 14 and the organic semiconductor layer 20 as long as desired transistor characteristics are provided, and it is not necessary to form the voltage control layer 22 in the whole area. As long as there is no problem in provided transistor characteristics, it may be formed not in an area between the insulating film 14 and the organic semiconductor layer 20, but on the source electrode 16 and the drain electrode 18.

Figure 2D:
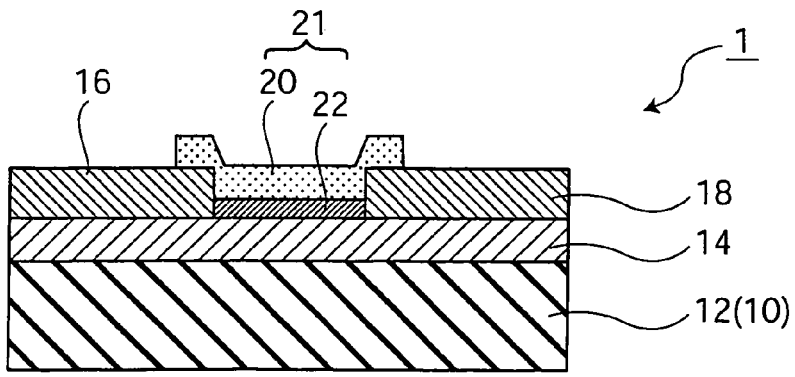

As shown in FIG. 2D, the organic semiconductor layer 20 is formed in contact with the voltage control layer 22 on the gate electrode 12 (substrate 10). As mentioned above, fullerenes including $C_{60}$, $C_{82}$, and metallofullerenes incorporating metal (e.g. $Dy@C_{82}$) are preferably used as the organic semiconductor layer 20. Alternatively, organic low-molecular substances such as pentacene and oligothiophene, organic polymers such as polythiophene, metal complexes such as phthalocyanine, and carbon nanotubes can also be used.

A method for depositing the organic semiconductor layer 20 is not particularly limited. Vapor deposition such as molecular beam epitaxy (MBE), spin coating and casting can be employed. A method for patterning the deposited film is also not particularly limited, and lithography or ink jetting can be employed, for instance.

Since the voltage control layer 22 gives ambipolar characteristics to the organic semiconductor layer 20 in the organic thin film transistor 1 formed as described above, the organic semiconductor film 21 consisting of the voltage control layer 22 and the organic semiconductor layer 20 has the ambipolar characteristics. Accordingly, the organic semiconductor film 21 can serve either as an n-channel or p-channel region with the same material. Therefore, the organic thin film transistor 1 in this embodiment can be formed either as an nMOS or PMOS transistor with the same material, without changing organic semiconductor materials for forming each channel region. As a result, it is unnecessary to use separate organic semiconductor materials for nMOS and pMOS transistors, which simplifies the manufacturing process and improve productivity.

Since the organic semiconductor film 21 used in the organic thin film transistor 1 can serve either as n-channel or p-channel region, the productivity of a semiconductor element using the transistor can be improved.

EXPERIMENTAL EXAMPLES

Ambipolar characteristics of the organic semiconductor film 21 will now be described by taking an example of using Dy@$C_{82}$ as the organic semiconductor layer 20.

An embodiment of the organic thin film transistor 1 shown in FIG. 1 has the following structure.

An n-type single crystal silicon substrate is used as the substrate 10 that is the gate electrode 12 here. A thermally oxidized film that is the gate insulating film 14 is formed to a thickness of 300 nm on the substrate 10 (12). On top of that, the source electrode 16 and the drain electrode 18 are formed using gold (Au). Both the source electrode 16 and the drain electrode 18 are formed to a thickness of 100 nm. Next, the voltage control layer 22 is formed by CVD on the gate insulating film 14 that has been exposed, with the silane compounds (a) and (b) below as two embodiment examples:

$CF_3(CH_2)_9Si(OC_2H_5)_3$                                 (a)

$CH_3(CH_2)_7Si(OC_2H_5)_3$                                  (b)

A Dy@$C_{82}$ film is deposited by MBE on the voltage control layer 22 and patterned to be the organic semiconductor layer 20. The film is deposited at a vacuum for film growth of $1 \times 10^{-9}$ torr, a deposition rate of 0.15 A/s, and a substrate temperature of 90 degrees Celsius.

For comparison, another organic thin film transistor is prepared in which a Dy@$C_{82}$ film is directly deposited on the gate insulating film 14 and patterned to be the organic semiconductor layer 20, without the voltage control layer 22.

Figure 3:
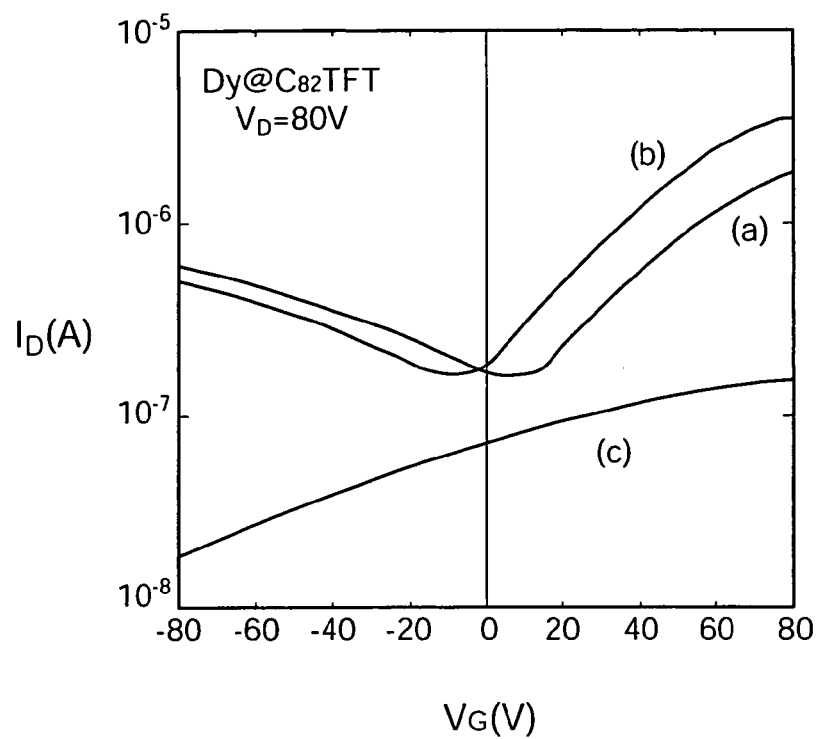
FIG. 3 is a graph showing the relationship between drain current and gate voltage.

FIG. 3 shows the relation between drain current (ID) and gate voltage (VG) when the source/drain voltage (VD) is set at 80V with the transistors of the two embodiment examples and one comparison example. In FIG. 3, the vertical axis represents the logarithm of ID. Also in FIG. 3, results of the embodiment examples using the compounds of the formulae (a) and (b) as the voltage control layer 22 are indicated by lines (a) and (b), respectively. Results of the comparison example is indicated by line (c).

Referring to FIG. 3, the transistor of the comparison example (c) without the voltage control layer 22 operates as an n-type, normally-on field effect transistor (FET). As for the transistors of the embodiment examples (a) and (b) with the voltage control layer 22, however, ID goes down as VG decreases, but turns to go up when VG surpasses a certain level. In other words, while the comparison example (c) does not show ambipolar characteristics at least within the measured VG range, the embodiment examples exhibit ambipolar characteristics within the range of normal working voltage.

As described above, the thin film FET (organic thin film transistor 1) of the comparison example using Dy@$C_{82}$ for the organic semiconductor layer 20 in FIG. 1 without the voltage control layer 22 operates as an n-type, normally-on FET, and thus represents a large negative threshold voltage (Vth). This is because Dy@$C_{82}$ molecules have such a small HOMO-LUMO gap that thermal excitation provides conductivity even when VG is 0V, at which no carrier enters.

Figure 4A:
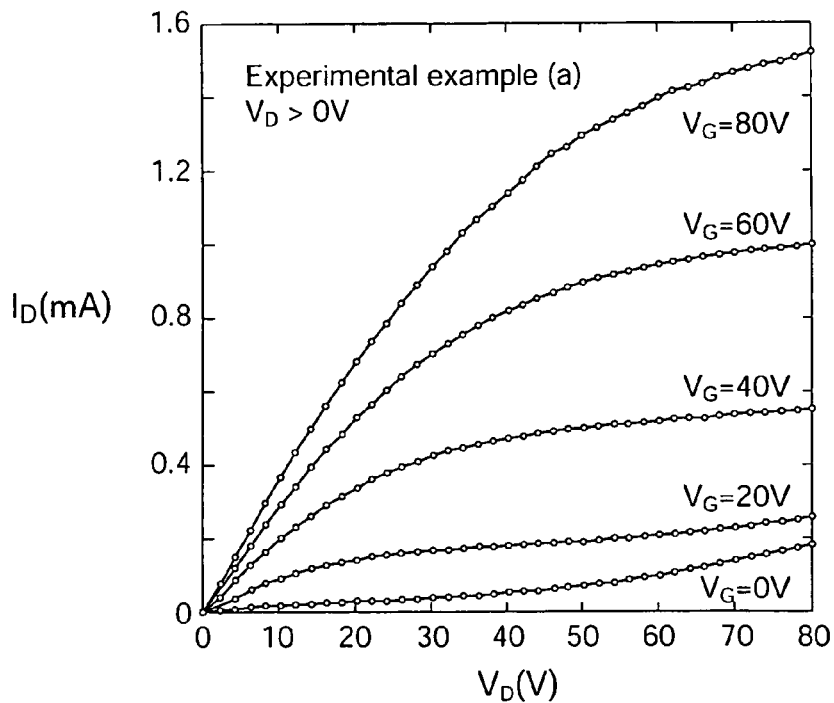
FIGS. 4A and 4B are graphs showing the relationship between drain current and drain voltage.

Therefore, in this n-type FET, ID increases when VG is positive from the values when VG is 0V as shown in FIG. 4A because of its ID-VD characteristics.

Figure 4B:
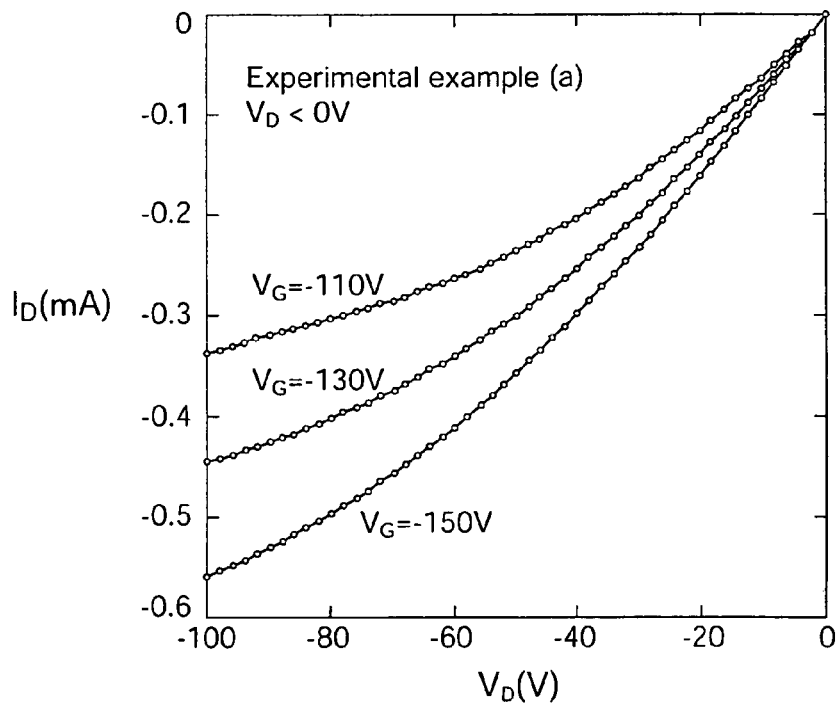

Meanwhile, the conductive layer of electrons receives holes when VG is negative, and thereby a decrease in VG restricts ID, even if ID is finite as shown in FIG. 4B. Since Dy@$C_{82}$ molecules have an extremely small HOMO-LUMO gap, hole conduction in the valence band occurs by making VG extremely small (negatively large). ID goes down as VG decreases in this case, whereas ID turns to go up when VG surpasses a certain level as shown in FIG. 3 and thus exhibits ambipolar characteristics in the organic semiconductor film 21 by providing (joining) the organic semiconductor layer 20 with the voltage control layer 22.

What effects of the voltage control layer 22 cause this phenomenon remains unknown, but it is conceivable that a small gap in the organic semiconductor film 21 consisting of the voltage control layer 22 and Dy@$C_{82}$ causes hole conduction.

Figure 5A:
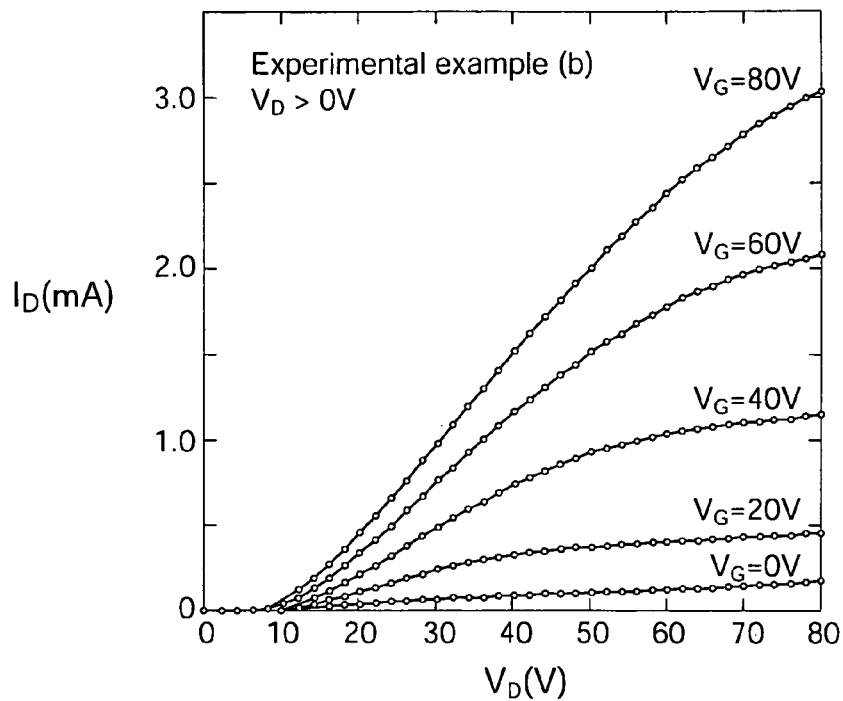
FIGS. 5A and 5B are graphs showing the relationship between drain current and drain voltage.
Figure 5B:
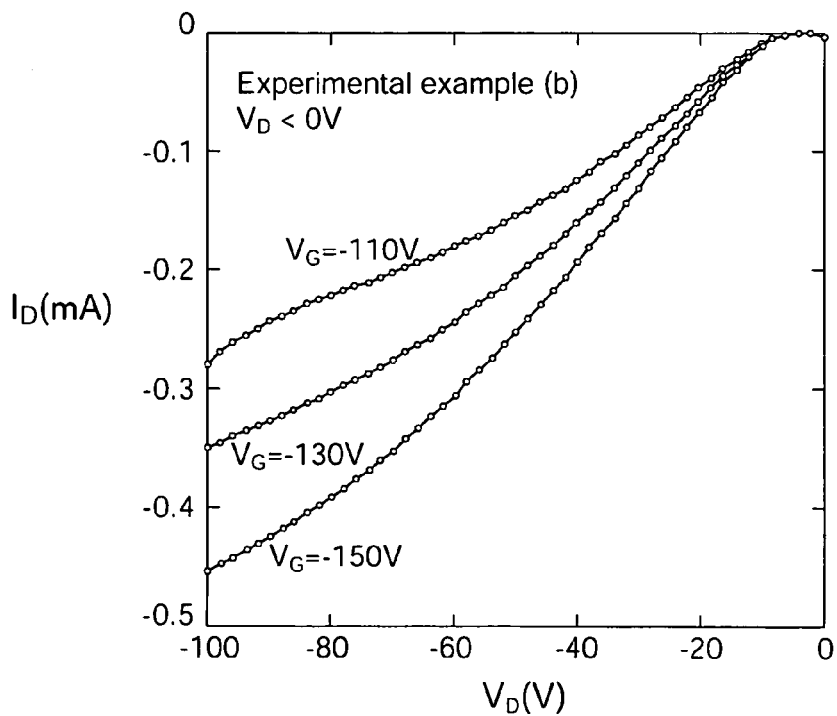

FIGS. 4 and 5 show the relation between drain current (ID) and drain voltage (VD) when VD is positive or negative with the transistors of the two embodiment examples. Referring to FIGS. 4A and 5A, ID goes up as VG increases from 0V, showing that the two example transistors exhibit the characteristics of an n-type transistor. Referring to FIGS. 4B and 5B, ID goes up as VG decreases (becomes negatively large) from −110V, showing that the two example transistors exhibit the characteristics of a p-type transistor.

The example using Dy@$C_{82}$ without the voltage control layer 22 does not exhibit ambipolar characteristics within the negative voltage range in FIG. 3, but possibly exhibits ambipolar characteristics within a voltage range lower (negatively larger) than its normal working condition. This is because hole conduction in the valence band occurs by making VG extremely small (negatively large) as described above. With the voltage control layer 22 according to the present invention, however, the current-voltage characteristics of the organic semiconductor layer 20 exhibiting no ambipolar characteristics in its normal working condition are changed, so that the organic semiconductor layer 20 can exhibit ambipolar characteristics in its normal working condition. The present invention thus provides the voltage control layer 22 that gives ambipolar characteristics to the organic semiconductor layer 20 in such a case.

The voltage control layer 22 not only gives ambipolar characteristics to the organic semiconductor layer 20, but also controls the threshold voltage of the organic semiconductor layer 20 (organic semiconductor film 21). This effect will now be described by taking an example of using a fullerene ($C_{60}$) as the organic semiconductor layer 20.

Here, an embodiment of the organic thin film transistor 1 shown in FIG. 1 has the following structure.

An n-type single crystal silicon substrate is used as the substrate 10 that is the gate electrode 12 here. A thermally oxidized film that is the gate insulating film 14 is formed to a thickness of 300 nm on the substrate 10 (12). On top of that, the source electrode 16 and the drain electrode 18 are formed using gold (Au). Both the source electrode 16 and the drain electrode 18 are formed to a thickness of 100 nm. Next, the voltage control layer 22 is formed by CVD on the gate insulating film 14 that has been exposed, with the silane compounds (a) and (b) below as two embodiment examples:

$CF_3(CH_2)_9Si(OC_2H_5)_3$                            (a)

$CH_3(CH_2)_7Si(OC_2H_5)_3$                            (b)

A fullerene ($C_{60}$) film is deposited by MBE on the voltage control layer 22 and patterned to be the organic semiconductor layer 20. The film is deposited at a vacuum for film growth of $1 \times 10^{-9}$ torr, a deposition rate of 0.15 A/s, and a substrate temperature of 90 degrees Celsius.

Figure 6:
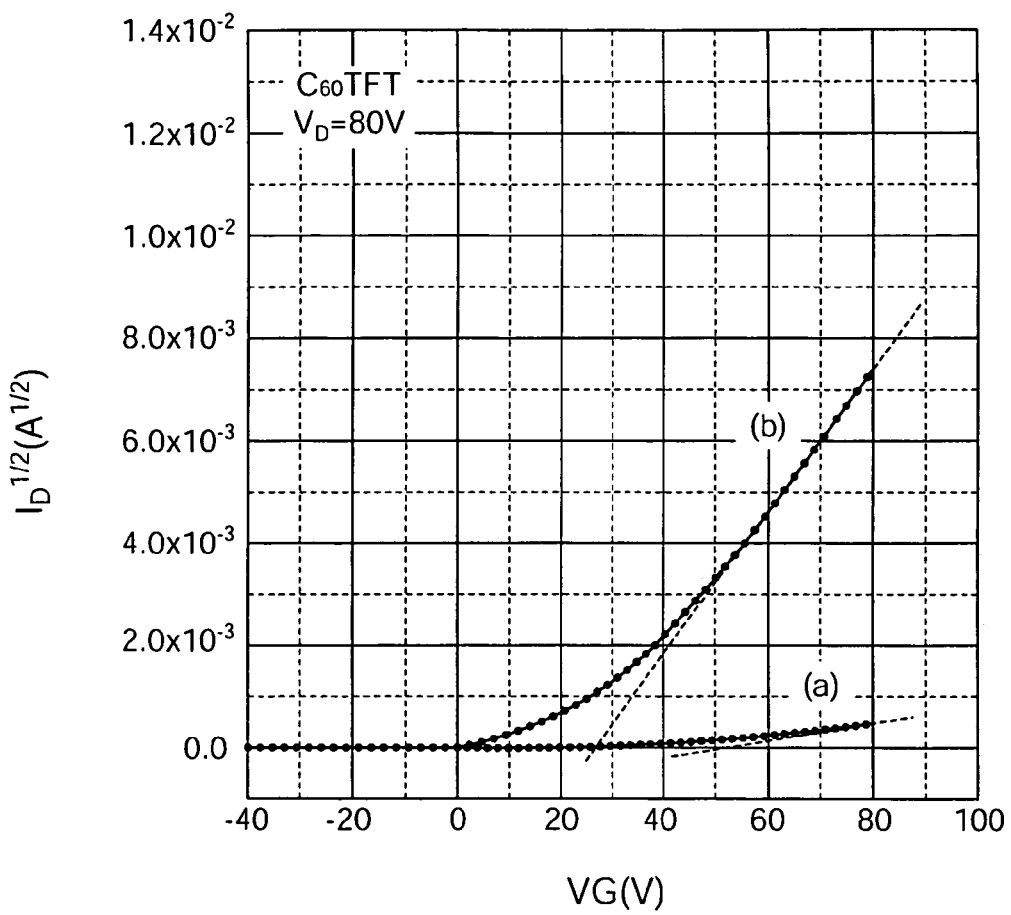
FIG. 6 is a graph showing the relationship between drain current and gate voltage.

FIG. 6 shows the relation between drain current (ID) and gate voltage (VG) when the source/drain voltage (VD) is set at 80V with the transistors of the two embodiment examples. In FIG. 6, the vertical axis represents the root of ID. Also in FIG. 6, results of the embodiment examples using the compounds of the formulae (a) and (b) as the voltage control layer 22 are indicated by lines (a) and (b), respectively.

Referring to FIG. 6, the characteristics of the silane compounds (a) and (b) in this order are shifted to the left. Here, the intersection of the broken line extrapolated by the linear portion to the left in the graph and the horizontal axis (ID=0) is threshold voltage (Vth). The diagram shows that the threshold voltage of (b) is smaller than that of (a). This means that it is possible to control the threshold voltage of a thin film transistor ($C_{60}$-TFT) having the organic semiconductor layer 20 made of a fullerene ($C_{60}$) by using the voltage control layer 22.

Complementary Transistor

Another embodiment of the organic semiconductor device according to the present invention will now be described. Here, the organic semiconductor device according to the present invention is applied to a complementary metal-oxide semiconductor (CMOS) transistor.

Figure 7:
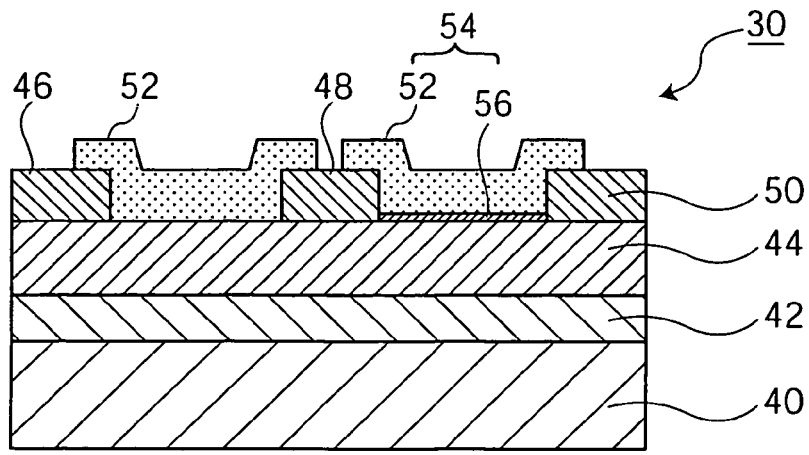
FIG. 7 is a sectional view schematically showing a complementary transistor according to the present invention.

FIG. 7 is a drawing illustrating a CMOS transistor corresponding to the organic semiconductor device according to the present invention. FIG. 7 shows a CMOS transistor 30. The CMOS transistor 30 includes a gate electrode 42 and a gate insulating film 44 provided in this order on a substrate 40, and also includes a source electrode 46, a drain/source electrode 48 and a drain electrode 50 provided on the gate insulating film 44. The CMOS transistor 30 also includes an organic semiconductor layer 52 provided between the source electrode 46 and the drain/source electrode 48, and an organic semiconductor film 54 provided between the drain/source electrode 48 and the drain electrode 50. The drain/source electrode 48 serves as a drain electrode for the source electrode 46 and the organic semiconductor layer 52, and as a source electrode for the drain electrode 50 and the organic semiconductor film 54. The organic semiconductor film 54 is one embodiment of the organic semiconductor film according to the present embodiment. The organic semiconductor film 54 consists of the organic semiconductor layer 52 and a voltage control layer 56 that gives ambipolar characteristics to the organic semiconductor layer 52. The voltage control layer 56 and the organic semiconductor layer 52 are provided in this order on the gate insulating film 44.

Like the organic thin film transistor 1 shown in FIG. 1, fullerenes including $C_{60}$, $C_{82}$, and metallofullerenes incorporating metal (e.g. a fullerene incorporating dysprosium (Dy), hereinafter referred to as Dy@$C_{82}$) are preferably used as a material of the organic semiconductor layer 52 in the CMOS transistor 30 having the above-described structure.

The voltage control layer 56 gives ambipolar characteristics to the organic semiconductor layer 52 made of the above-mentioned materials. Also as mentioned above, silane compounds represented by the formula $R^1(CH_2)_m SiR^2{}_n X_{3-n}$ (m: a counting number; n: 1 or 2) are preferably used for the voltage control layer 56.

Figure 8A:
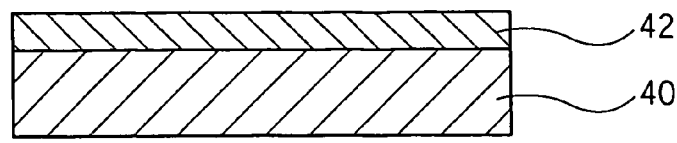
FIGS. 8A to 8E are process drawings illustrating the manufacturing of the complementary transistor shown in FIG. 7.

In order to manufacture the CMOS transistor 30 having the above-described structure, a p- or n-type single crystal silicon substrate in which an impurity such as boron (B), phosphorous (P) or antimony (Sb) is doped; glass substrate; quartz substrate; or plastic substrate such as polymethylmethacrylate, polyethersulphone, or polycarbonate is prepared as shown in FIG. 8A. In the present embodiment, a single crystal silicon substrate is used as the substrate 40. An impurity is doped in its surface layer to be the gate electrode 42 as shown in FIG. 8A.

Figure 8B:
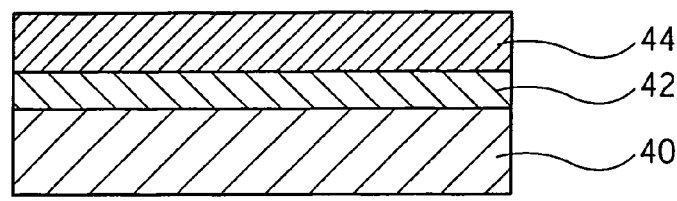

Subsequently, the gate insulating film 44 is formed to a thickness of about 100 to 800 nm on the substrate 10 (gate electrode 12) as shown in FIG. 8B. In order to form the gate insulating film 44, for example, the surface of the substrate is oxidized by thermal oxidation to form silicon dioxide ($SiO_2$) to be the gate insulating film 44. Alternatively, an insulating film made of $SiO_2$, $Al_2O_3$ or the like is formed by sputtering or vacuum deposition such as CVD so as to form the gate insulating film 44.

Figure 8C:
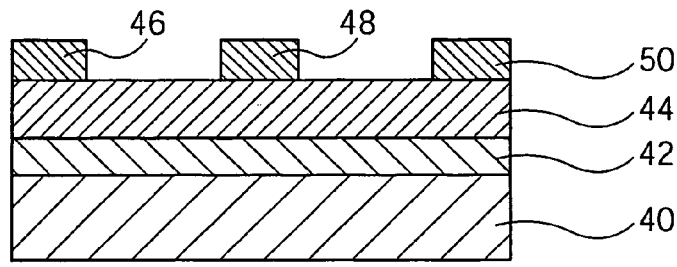

The source electrode 46, the drain/source electrode 48 and the drain electrode 50 are formed to a thickness of about 50 to 300 nm as shown in FIG. 8C. Various kinds of metals, metal oxides, and carbon can be used as materials of the source electrode 16 and the drain electrode 18. Specifically, if the organic semiconductor layer 20 is made of a fullerene ($C_{60}$, $C_{82}$, and a metallofullerene incorporating metal), platinum (Pt), gold (Au), silver (Ag), copper (Cu), aluminum (Al), and indium tin oxide (ITO) are preferably used. In order to form the source electrode 46, the drain/source electrode 48 and the drain electrode 50 having a predetermined shape, for example, a conductive thin film is formed on the gate insulating film 44 by vacuum deposition and then the thin film is patterned by lithography.

Figure 8D:
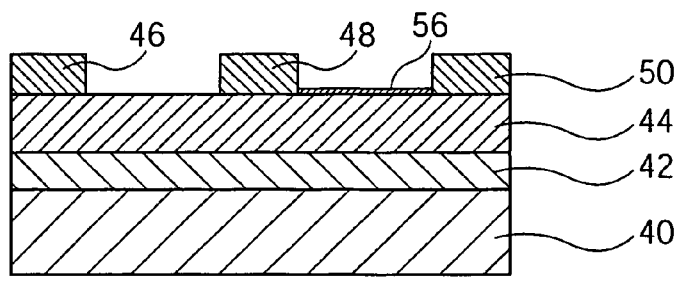

The voltage control layer 56 is formed to a thickness of 3 nm or less, for example, as shown in FIG. 8D. As mentioned above, the voltage control layer 56 gives ambipolar characteristics to the organic semiconductor layer 52. If the organic semiconductor layer 52 is made of a fullerene, silane compounds represented by the formula $R^1(CH_2)_m SiR^2{}_n X_{3-n}$ (m: a counting number; n: 1 or 2) are preferably used. Such a silane compound with X being in the halogen or alkoxy group in particular is easily chemically absorbed to the oxide surface made of $SiO_2$ or $Al_2O_3$, for example, of the gate insulating film 44. Therefore, a dense and rigid ultrathin film (monomolecular film) is formed.

Additionally, by disposing the end group $R^1$ on the surface of the voltage control layer 56, its chemical affinity for the organic semiconductor layer 52 made of a fullerene, for example, becomes strong.

In the present embodiment, the above-mentioned silane compound (a) [$CF_3(CH_2)_9Si(OC_2H_5)_3$] is used as a silane compound represented by the above-mentioned formula.

The silane compound not only gives ambipolar characteristics to the organic semiconductor layer 52, but also controls threshold voltage characteristics of the organic semiconductor layer 52.

A method for forming the voltage control layer 56 is not particularly limited. For example, vapor phase methods such as CVD, and liquid phase methods such as spin coating and dipping can be used. Also, deposition and patterning can be performed at the same time by mask deposition, for example.

Like the organic thin film transistor 1 shown in FIG. 1, before forming the voltage control layer 56, at least its underlying surface (the gate insulating film 44 here) is preferably treated to be lyophilic. Furthermore, unnecessary adsorbates may be removed by cleansing after forming the voltage control layer 56.

Note that it is sufficient to form the voltage control layer 56 in a partial area between the gate insulating film 44 and the organic semiconductor layer 52, as long as desired transistor characteristics are provided, and it is not necessary to form the voltage control layer 56 in the whole area. As long as there is no problem in provided transistor characteristics, it may be formed not in an area between the insulating film 44 and the organic semiconductor layer 52, but on the drain/source electrode 48 and the drain electrode 50.

Figure 8E:
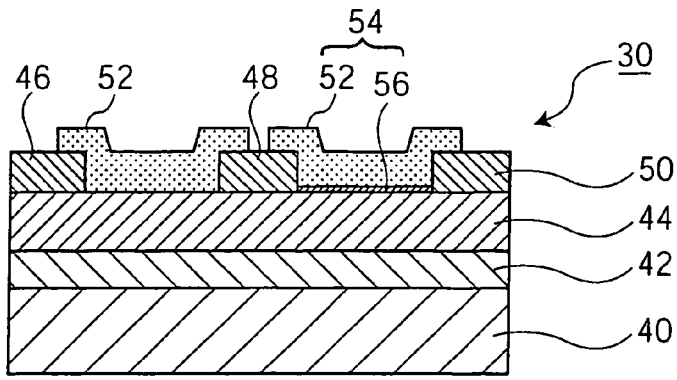

The organic semiconductor layer 52 is formed at least between the source electrode 46 and the drain/source electrode 48 and between the drain/source electrode 48 and the drain electrode 50 as shown in FIG. 8E. The organic semiconductor layer 52 is thus deposited between the source electrode 46 and the drain/source electrode 48 and also on the voltage control layer 56 disposed between the drain/source electrode 48 and the drain electrode 50. The organic semiconductor film 54 according to the present invention is thus formed between the drain/source electrode 48 and the drain electrode 50 in particular. Also, after depositing the organic semiconductor layer 52, unnecessary parts of the organic semiconductor layer 52 may be patterned and removed as required.

To deposit the organic semiconductor layer 52, vapor deposition such as MBE, spin coating and casting can be employed. A method for patterning the deposited film is also not particularly limited, and lithography or ink jetting can be employed, for instance. Also, deposition and patterning can be performed at the same time by mask deposition, for example.

In the CMOS transistor 30 formed this way, the voltage control layer 56 is provided in one of the two channel regions consisting of the organic semiconductor layer 52. Ambipolar characteristics are given to an organic semiconductor layer 52 that is in contact with the voltage control layer 56.

Here, one organic semiconductor layer 52 that is not provided with the voltage control layer 56 becomes an n-type, enhancement-mode FET on one hand. The other organic semiconductor layer 52 (organic semiconductor film 54) that is provided with the voltage control layer 56, on the other hand, becomes a p-type, enhancement-mode FET since ambipolar characteristics have been given.

Figure 9:
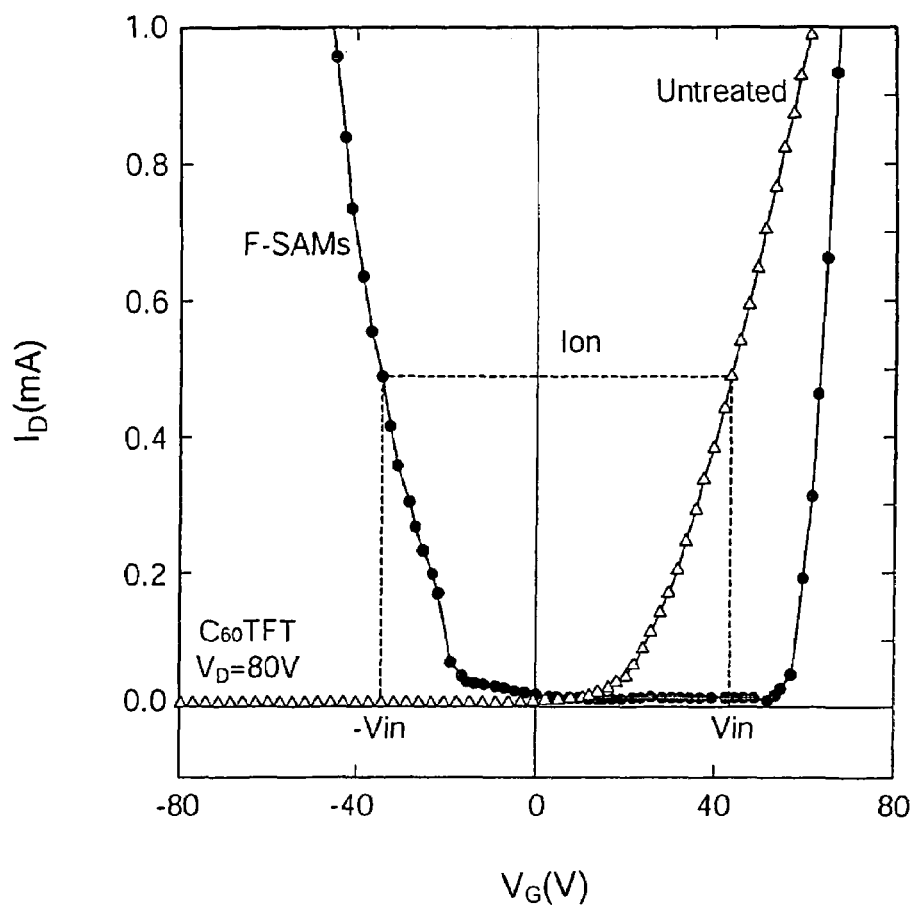
FIG. 9 is a graph showing the relationship between drain current and gate voltage.

FIG. 9 shows ID-VG characteristics of one organic semiconductor layer 52 not provided with the voltage control layer 56 and made of fullerene $C_{60}$ (indicated as "Untreated" in the graph) and of the other organic semiconductor layer 52 provided with the voltage control layer 56 and made of fullerene $C_{60}$ (indicated as "F-SAMs"). Referring to FIG. 9, while the organic semiconductor layer 52 made of fullerene $C_{60}$ has n-type, enhancement-mode characteristics, it exhibits p-type, enhancement-mode characteristics within a negative VD range since the voltage control layer 56 is provided and thus ambipolar characteristics are given. Therefore, the CMOS transistor 30 can be either in ON and OFF conditions at +40V and −40V with some variations.

Figure 10:
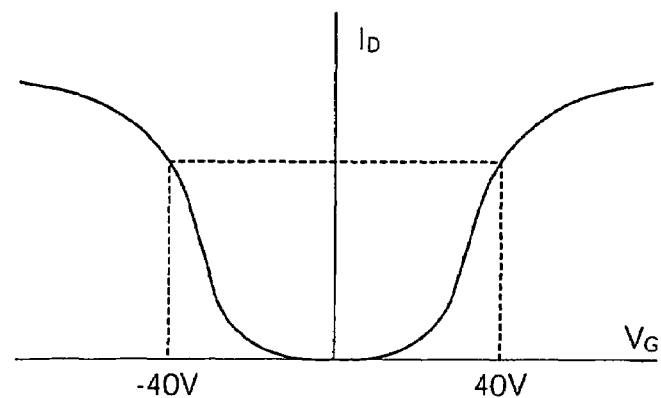
FIG. 10 is a graph schematically showing the relationship between drain current and gate voltage.
Figure 11:
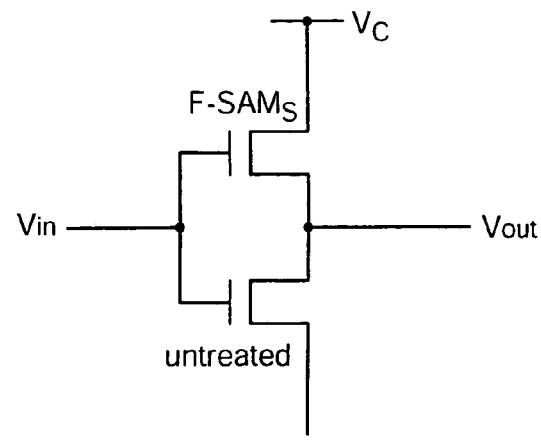
FIG. 11 is a circuit diagram of a complementary transistor.

In other words, the two FETs are in ON and OFF conditions when Vin is at +40V and −40V in the CMOS transistor 30 as schematically shown in FIG. 10. It should be noted that 0V (ground) and finite voltages are not input signals in a circuit of the CMOS transistor 30. In such a circuit as shown in FIG. 11, Vout is invertible when Vin is 40V at high and −40V at low, Vcc is 40V, and the ground is set at −40V. In FIG. 11, one organic semiconductor layer 52 not provided with the voltage control layer 56 is indicated as "Untreated" and the other organic semiconductor layer 52 (organic semiconductor film 54) provided with the voltage control layer 56 is indicated as "F-SAMs".

Accordingly, the square wave (Vmax=40V, Vmin=−40V) shown in FIG. 9 can be inverted. The organic semiconductor (a fullerene part alone) partially patterns the silane compound (a) as the voltage control film, making a NOT circuit available.

Consequently, since the voltage control layer 56 gives ambipolar characteristics to the organic semiconductor layer 52 in the CMOS transistor 30, the organic semiconductor layer 52 has the ambipolar characteristics, making it possible to form each semiconductor layer (channel region) with the same material without changing semiconductor materials for individual channel regions. Accordingly, it is unnecessary to use separate organic semiconductor materials for nMOS and PMOS portions, which simplifies the manufacturing process and improve productivity.

It should be understood that the present invention is not limited to the above-described embodiments. Various modifications can be made without departing from the spirit and scope of the present invention.

Figure 12:
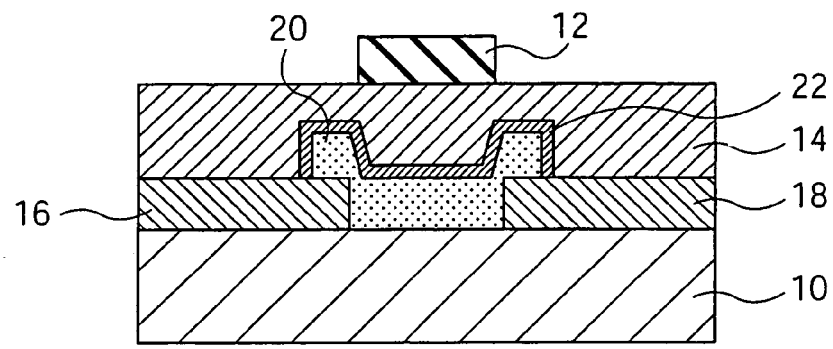
FIG. 12 is a sectional view schematically showing a modification of the organic thin film transistor according to the present invention.

For example, when the organic semiconductor device according to the present invention is applied to an organic thin film transistor, the voltage control layer 22 may be provided on the organic semiconductor layer 20 and the gate electrode 12 may be provided on top of that with the gate insulating film 14 therebetween as shown in FIG. 12, instead of using the structure shown in FIG. 1. This structure provides higher substrate layout flexibility than the structure shown in FIG. 1.

Figure 13:
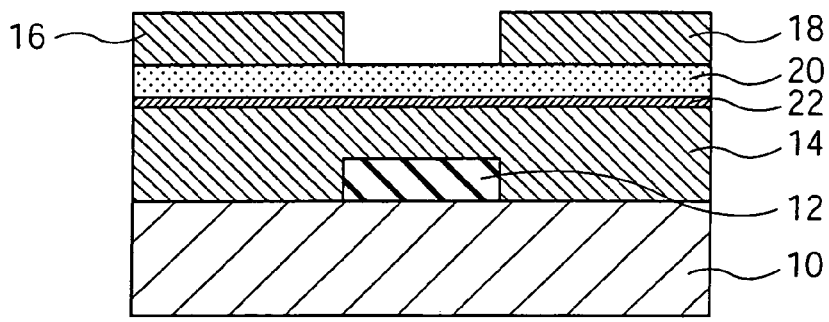
FIG. 13 is a sectional view schematically showing a modification of the organic thin film transistor according to the present invention.

Alternatively, the source electrode 16 and the drain electrode 18 may be provided on the organic semiconductor film 20 as shown in FIG. 13. Since the organic semiconductor film 20 is less sensitive to the source electrode 16 and the drain electrode 18, this structure provides higher carrier mobility than the structure shown in FIG. 1.

What is claimed is:

1. A device comprising:
a source electrode;
a source/drain electrode;
a drain electrode;
a first organic semiconductor layer directly contacting the source/drain electrode and the drain electrode;
a second organic semiconductor layer directly contacting the source electrode and the source/drain electrode; and
a voltage control layer consisting of $CF_3(CH_2)_9Si(OC_2H_5)_3$ disposed directly beneath the first organic semiconductor layer and directly contacting the drain electrode and the source/drain electrode, the voltage control layer giving an ambipolar characteristic to the first organic semiconductor layer.

2. An organic semiconductor device comprising:
a substrate;
a gate electrode formed directly on the substrate;
a gate insulating film formed directly on the gate electrode;
a source electrode and a drain electrode formed directly on the gate insulating film;
an organic semiconductor layer formed directly on the source electrode and the drain electrode; and
a voltage control layer disposed directly between the gate insulating film and the organic semiconductor layer and directly contacting the source electrode and the drain electrode, the voltage control layer giving an ambipolar characteristic to the organic semiconductor layer,
wherein the voltage control layer consists of $CF_3(CH_2)_9Si(OC_2H_5)_3$.

3. The organic semiconductor device according to claim 2, wherein a thickness of the voltage control layer is three nanometers or less.

4. The organic semiconductor device according to claim 2, wherein the voltage control layer is chemically absorbed to at least one of the gate insulating film and the organic semiconductor layer.

5. The organic semiconductor device according to claim 2, wherein the organic semiconductor layer is made of at least one of an organic low-molecular substance, organic polymer, metal complex, fullerene, and carbon nanotube.

6. The organic semiconductor device according to claim 2, wherein the organic semiconductor device is an organic thin film transistor.

7. The organic semiconductor device according to claim 2, wherein the organic semiconductor device is a complementary transistor.

* * * * *

UNITED STATES PATENT AND TRADEMARK OFFICE
CERTIFICATE OF CORRECTION

PATENT NO. : 7,482,623 B2
APPLICATION NO. : 11/085460
DATED : January 27, 2009
INVENTOR(S) : Takao Nishikawa It is certified that error appears in the above-identified patent and that said Letters Patent is hereby corrected as shown below:

On the Title Page, Item (*) Notice:, Line 4, insert --This patent is subject to a terminal disclaimer.--.

On the Title Page, Item (56) OTHER PUBLICATIONS, Lines 1-3, delete "D.J. Gundlach et al., "Thin-film transistors based on well-ordered thermally evaporated napthaceen films", American Institute of Physics, vol. 80, No. 16, pp. 2925-2927 (2002).*" (duplicate entry)

On the Title Page, (57) ABSTRACT, Line 2, "substrate ," should be --substrate,--.

Column 1, Line 56, after "PMOS" should be --pMOS--.

Column 6, Line 57, "PMOS" should be --pMOS--.

Column 11, Line 62, "PMOS" should be --pMOS--.

Signed and Sealed this

Twenty-second Day of September, 2009

David J. Kappos
*Director of the United States Patent and Trademark Office*